(12) United States Patent
Rundle et al.

(10) Patent No.: US 10,959,334 B2
(45) Date of Patent: Mar. 23, 2021

(54) MULTIPLE PARTS CLAMPED TOGETHER

(71) Applicant: Apple Inc., Cupertino, CA (US)

(72) Inventors: Nicholas A. Rundle, San Jose, CA (US); Mackenzie D. Porter, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/384,814

(22) Filed: Apr. 15, 2019

(65) Prior Publication Data

US 2020/0107445 A1 Apr. 2, 2020

Related U.S. Application Data

(60) Provisional application No. 62/737,286, filed on Sep. 27, 2018.

(51) Int. Cl.
*H05K 1/18* (2006.01)

(52) U.S. Cl.
CPC ... *H05K 1/184* (2013.01); *H05K 2201/09063* (2013.01); *H05K 2201/10189* (2013.01)

(58) Field of Classification Search
USPC ........................................................ 361/761
See application file for complete search history.

(56) References Cited

U.S. PATENT DOCUMENTS

| 6,798,649 | B1 | 9/2004 | Olodort et al. | |
| 8,917,499 | B1 | 12/2014 | Read | |
| 2004/0195305 | A1 | 10/2004 | Dotson | |
| 2010/0307162 | A1* | 12/2010 | Bottcher | F23R 3/007 60/752 |
| 2016/0131362 | A1* | 5/2016 | Vogtmann | F23R 3/007 60/752 |

FOREIGN PATENT DOCUMENTS

GB      2558679 A     7/2018

* cited by examiner

*Primary Examiner* — Andargie M Aychillhum
(74) *Attorney, Agent, or Firm* — Dickinson Wright RLLP (57) ABSTRACT

An electronic device is disclosed. The electronic device may include a first part coupled to a second part by a fastener. The first part may include a through hole and several spring elements that define the first through hole. The second part may include a through hole and several extensions that define the through hole. The electronic device may include a fastener used to secure the first part with the second part. In this manner, the fastener passes through respective through holes of the first part and the second part. Further, the fastener can engage and deform the spring elements such that the spring elements extend into the through hole of the second part. As a result, the spring elements are displaced and the fastener engages not only the spring elements but also the extensions. The parts may include circuit boards or sheet metal, as non-limiting examples.

20 Claims, 6 Drawing Sheets

MULTIPLE PARTS CLAMPED TOGETHER

CROSS-REFERENCE TO RELATED APPLICATION(S)

This application claims the benefit of priority to U.S. Provisional Application No. 62/737,286, filed on Sep. 27, 2018, titled "MULTIPLE PARTS CLAMPED TOGETHER," the disclosures of which are incorporated herein by reference in their entirety.

FIELD

The following description relates to electronic devices. In particular, the following description relates to clamping two or more parts together using a fastening element in a manner such that the fastening element engages a surface all parts being clamped together. The parts can be positioned in, and secured to, an electronic device by one or more fasteners.

BACKGROUND

Electronic devices include components fastened to walls of a housing. When two or more parts are fastened together, the number of fasteners required to fasten the parts increases, particularly when each component requires a minimum number of fasteners. Further, when the components are to be installed on a wall with openings, the number of locations that can receive a fastener is reduced.

SUMMARY

In one aspect, an electronic device is described. The electronic device may include a housing that defines an internal volume. The housing may further include a cavity. The electronic device may further include a first part that includes a first through hole defined by spring elements. The electronic device may further include a second part comprising a second through hole defined by extensions. The electronic device may further include a fastener that includes a fastener head and a shaft that extends from the fastener head. The shaft can be capable of aligning the fastener head with the first through hole and the second through hole such that when the first part and the second part are fastened together, (i) the fastener head engages the spring elements and the extensions, and (ii) the shaft is positioned within the cavity.

In another aspect, an electronic device is described. The electronic device may include a housing that includes a first opening and a second opening. The housing may further include a blind hole at least partially positioned between the first opening and the second opening. The electronic device may further include a first part that includes a first through hole that defines a spring element. The electronic device may further include a second part engaged with the first part. The second part may include a second through hole. The electronic device may further include a fastener positioned in the blind hole and passing through the first through hole and the second through hole. The fastener can cause the spring element to bend such that the spring element is positioned in the second through hole.

In another aspect, an electronic device is described. The electronic device may include a fastener that includes a fastener head. The fastener head may include a fastener diameter. The electronic device may further include a first part that includes a first through hole that defines a first diameter. The first part may include spring elements that define a second diameter of the through hole that is different from the first diameter. The second diameter can be less than the fastener diameter. The electronic device may further include a second part that includes a second through hole that defines a third diameter. The second part may include extensions that define a fourth diameter of the through hole that is different from the third diameter. The fourth diameter can be less than the fastener diameter. The electronic device may further include a housing that includes a cavity. In some instances, the fastener passes through the first through hole and the second through hole and is positioned in the cavity.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to electronic devices using with multiple parts secured together by fasteners. In particular, the following disclosure relates to fastening multiple part together in a manner such that the fasteners engage each part being fastened together. A fastener described herein may include a fastener head and a shaft extending from the fastener head. The parts may engage each other in a stacked configuration. Each part may include a through hole, or opening, with a unique geometry that allows the fastener to contact each of the parts. For example, a first part may include a through hole defined by multiple spring elements, which may include cantilevered spring elements. A second part may include a through hole defined by multiple extensions and multiple through hole sections. The first part is stacked over the second part, and a fastener fastens the first part with the second part. When the fastener is inserted into each through hole to clamp the parts together, the fastener engages the spring elements and applies a force that bends and elastically deforms the spring elements, thereby causing the spring elements (of the first part) to bend into the through respective through hole sections (of second part). As a result of the bending of the spring elements, the fastener engages both the first part and the second part. The engagement described herein between the fastener and both parts includes an engagement between the fastener head and both parts. In some instances, the shaft is not engaged with either of the parts.

By forming parts that can stack on each other and also engage the fastener, the resultant assembly provides a reliable arrangement in which both parts remain stationary. Also, with the fastener head providing direct engagement with both parts, electronic devices described herein may require fewer fasteners, which may reduce the weight of the electronic devices. Fewer fastener may result in fewer blind holes, or cavities, formed in a housing of an electronic device. Moreover, when fewer blind holes are required to be formed into the housing, the number of available locations in which the parts may be assembled to the housing increases. Also, fewer fasteners and fewer blind holes result in less manufacturing time to form the electronic device.

These and other embodiments are discussed below with reference to FIGS. 1-10. However, those skilled in the art will readily appreciate that the detailed description given herein with respect to these Figures is for explanatory purposes only and should not be construed as limiting.

Figure 1:
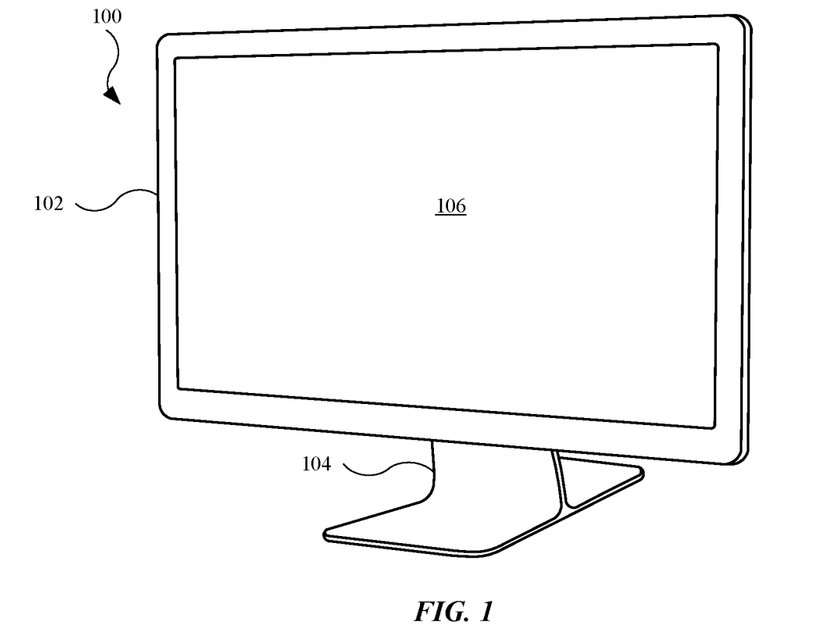
FIG. 1 illustrates a front isometric view of an embodiment of an electronic device, in accordance with some described embodiments.

FIG. 1 illustrates a front isometric view of an embodiment of an electronic device 100, in accordance with some described embodiments. In some embodiments, the electronic device 100 includes a mobile wireless computing device, such as a smartphone or a tablet computing device. In the embodiment shown in FIG. 1, the electronic device 100 includes a desktop computing device. The electronic device 100 include a housing 102 that is formed from a metal, such as aluminum, aluminum alloy, or other rigid material(s). The electronic device 100 may further include a stand 104 rotationally coupled to the housing 102. The electronic device 100 may further include a display 106 that is carried by the housing 102. The display 106 is designed to present visual information in the form of still images, motion images (such as video), and/or textual information. The housing 102 may provide an internal volume, or space, for internal components (not shown in FIG. 1), such as circuit boards, processor circuits (including central processing units and graphics processing units), memory circuits, audio modules, microphones, flexible circuits, and batteries, as non-limiting examples.

Figure 2:
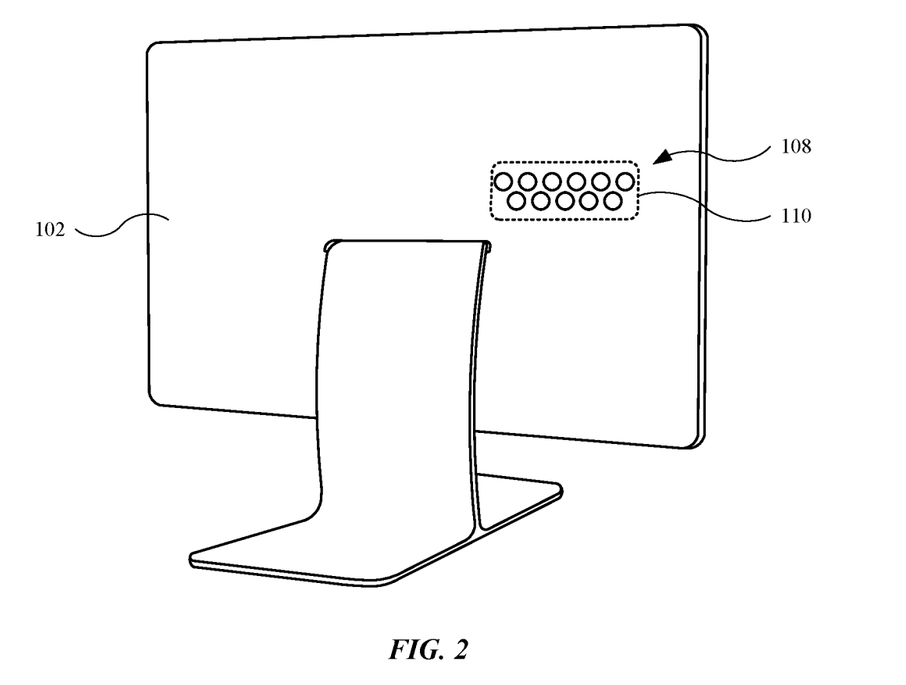
FIG. 2 illustrates a rear isometric view of the electronic device shown in FIG. 1, showing openings formed in the housing and an assembly positioned in the housing.

FIG. 2 illustrates a rear isometric view of the electronic device 100 shown in FIG. 1, showing openings 108 formed in the housing 102 and an assembly 110 positioned in the housing 102. The openings 108 may define through holes that open to the internal volume defined by the housing 102. However, the assembly 110 may include one or more parts that cover the openings 108. The assembly 110 may take the form of various part assembled together. For example, in some embodiments, the assembly 110 includes multiple circuit boards stacked together. In some embodiments, the assembly 110 includes multiple sensing components stacked together.

Figure 3:
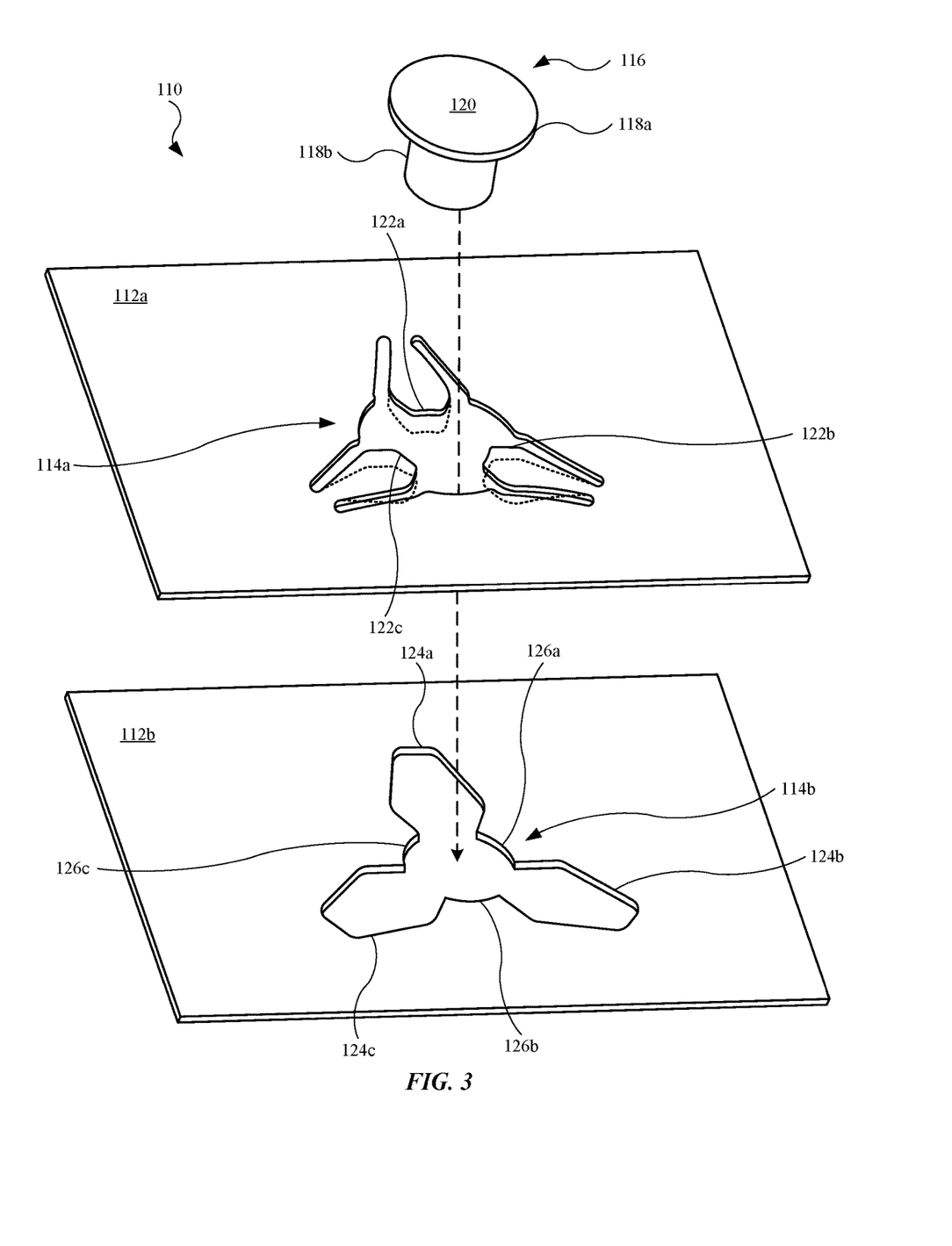
FIG. 3 illustrates an exploded view of an embodiment of an assembly, in accordance with some described embodiments.

FIG. 3 illustrates an exploded view of an embodiment of an assembly 110, in accordance with some described embodiments. The assembly 110 may include multiple parts disposed in the housing 102 (shown in FIGS. 1 and 2). The assembly 110 may include a part 112a and a part 112b. In some embodiments, the part 112a and/or the part 112b include a circuit board that carries multiple components. In some embodiments, the part 112a and/or the part 112b may include a metal layer, including a sheet metal layer, designed to obscure or cover openings (such as the openings 108, shown in FIG. 2) or carry other components of an electronic device.

The part 112a may be assembled with the part 112b. In this regard, the part 112a may include a through hole 114a, or opening, and the part 112b may include a through hole 114b. The assembly 110 may include a fastener 116 that passes through the through hole 114a and the through hole 114b. The fastener 116 may include a fastener head 118a and a shaft 118b, with the shaft 118b capable of passing through the through hole 114a and the through hole 114b. The fastener head 118a may include a tool receiving surface 120 designed to receive a tool (not shown in FIG. 3). As a result, the fastener 116 may couple the part 112a and the part 112b to a structure, such as the housing 102 (shown in FIGS. 1 and 2).

Traditionally, a fastener may engage a first part that is relatively closer to the fastener head (such as the part 112a), and provide a resultant indirect force to an additional part(s) (such as the part 112b). However, the assembly 110 (and assemblies described herein) may include enhancements to the parts such that the fastener 116 engages both the part 112a and the part 112b. Specifically, the fastener head 118a is designed to engage both the part 112a and the part 112b. This requires modifications to the through holes of the parts. For example, the through hole 114a of the part 112a is defined by a spring element 122a, a spring element 122b, and a spring element 122c, each of which may define a cantilevered spring element. These spring elements include flexible elements designed to elastically deform (as indicated by dotted lines) relative to remaining portions of the part 112a. However, in some instances, the deformation may be plastic deformation. To form the through hole 114a and the aforementioned spring elements, the part 112a may undergo a cutting operation, which may include laser cutting, stamping, or die cutting, as non-limiting examples.

Further, the through hole 114b in the part 112b may include features in accordance with the part 112a. For example, the through hole 114b is defined by a through hole section 124a, a through hole section 124b, and a through hole section 124c. Further, the through hole 114b is defined by an extension 126a, an extension 126b, and an extension 126c. The fastener head 118a may engage the spring element 122a, the spring element 122b, and the spring element 122c of the part 112a. The force provided by the fastener head 118a bends the spring element 122a, the spring element 122b, and the spring element 122c into the through hole section 124a, the through hole section 124b, and the through hole section 124c, respectively. Furthermore, based upon the bending of the spring element 122a, the spring element 122b, and the spring element 122c, the fastener head 118a can engage the extension 126a, the extension 126b, and the extension 126c of the part 112b. In this manner, the fastener 116 (by way of the fastener head 118a) directly engages the part 112a (by way of the spring element 122a, the spring element 122b, and the spring element 122c) and the part 112b (by way of the extension 126a, the extension 126b, and the extension 126c). Also, the fastener head 118a may engage both the part 112a and the part 112b, while the shaft 118b is free of engagement with the part 112a and the part 112b.

Figure 4:
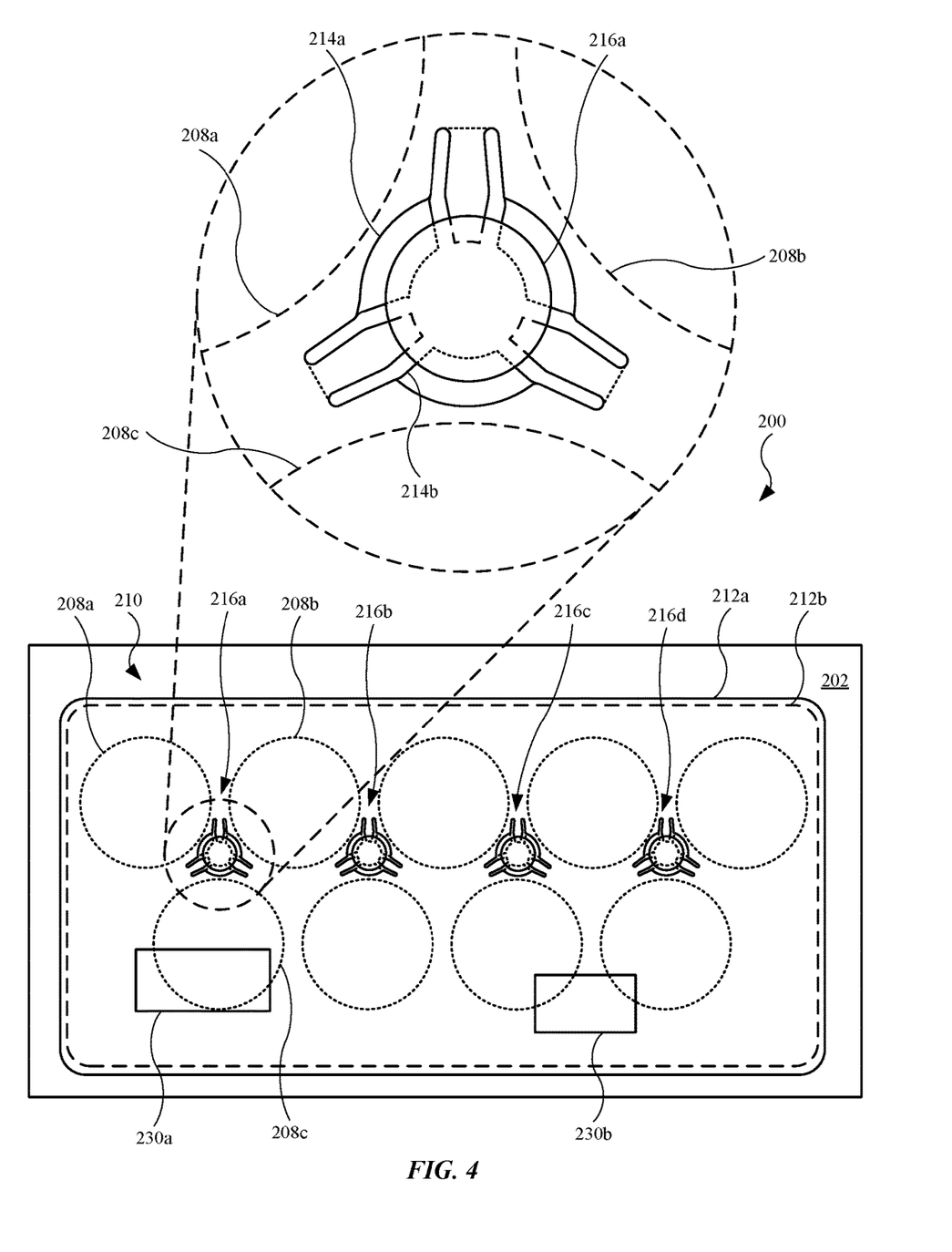
FIG. 4 illustrates an internal view of an electronic device, showing an assembly engaged with a housing of the electronic device, in accordance with some described embodiments.

FIG. 4 illustrates an internal view of an electronic device 200, showing an assembly 210 engaged with a housing 202 of the electronic device 200, in accordance with some described embodiments. The electronic device 200 may include any features described herein for an electronic device. As shown, the assembly 210 includes a part 212a and a part 212b (shown as a dotted line) coupled to the part 212a. The part 212a may include a circuit board. In this regard, the part 212a may include a component 230a and a component 230b. Each of the component 230a and the component 230b may include a processor circuit, power supply, memory circuit, or another component known in the art to be mounted on a circuit board.

The part 212a and the part 212b are coupled to the housing 202 by a fastener 216a, a fastener 216b, a fastener 216c, and a fastener 216d. As shown in the enlarged view, the fastener 216a may extend through a through hole 214a of the part 212a and a through hole 214b of the part 212b. The part 212a and the part 212b may include any features described for the part 112a and the part 112b, respectively, shown in FIG. 3. In this regard, the fastener 216a may engage with multiple spring elements (not labeled) of the part 212a and multiple extensions (not labeled) of the part 212b. The part 212a and the part 212b may include multiple through holes, similar to the through hole 214a and the through hole 214b, respectively. Accordingly, the fastener 216b, the fastener 216c, and the fastener 216d may pass through these through holes and engage spring elements of the part 212a and extensions of the part 212b, similar to a manner previously described.

Also, based upon the design geometry, the through holes can be positioned between adjacent openings in the housing 202. For example, the housing 202 includes an opening 208a, an opening 208b, and an opening 208c. As shown in the enlarged view, the design geometry of the through hole 214a and the through hole 214b do not overlap the opening 208a, the opening 208b, or the opening 208c. In other words, the through hole 214a and the through hole 214b are positioned between the opening 208a, the opening 208b, and the opening 208c. As a result, the housing 202 obscures the view of the through hole 214a and the through hole 214b (when viewing the electronic device 200 externally). Also, based upon the through hole 214b not overlapping the opening 208a, the opening 208b, or the opening 208c, the fastener 216a can be positioned between the opening 208a, the opening 208b, and the opening 208c, and can also be obscured by the housing 202. By using the design geometry of the through holes shown in FIG. 4, the fasteners can be located in relatively tight spaces, such as between adjacent openings in the housing 202, thereby increasing the available locations of the fasteners can attach to the housing 202.

Figure 5:
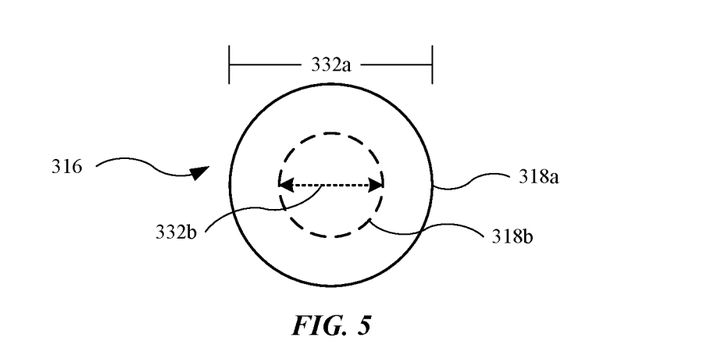
FIG. 5 illustrates a plan view of a fastener, in accordance with some described embodiments.
Figure 6:
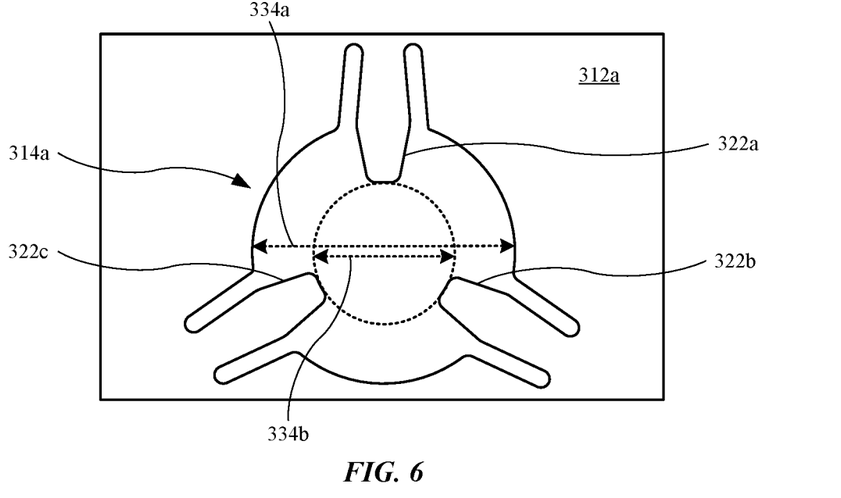
FIG. 6 illustrates a plan view of a part, showing a through hole in the part, in accordance with some described embodiments.
Figure 7:
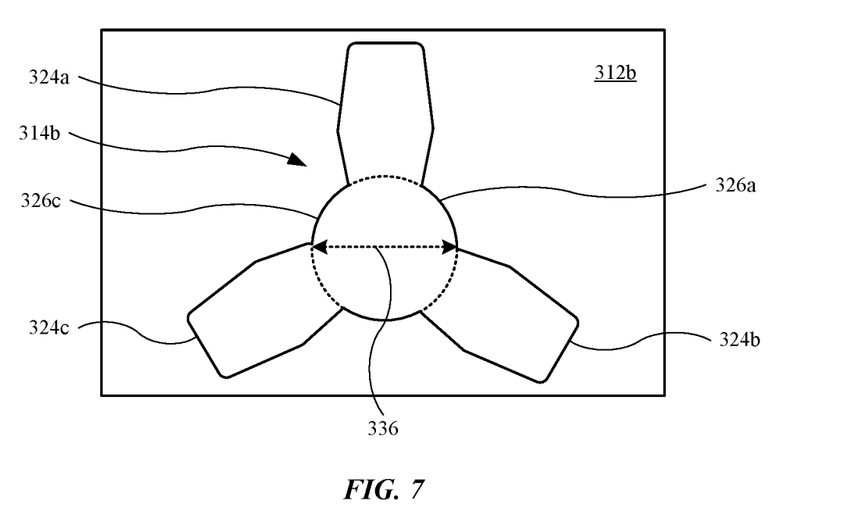
FIG. 7 illustrates a plan view of a part, showing a through hole in the part, in accordance with some described embodiments.

FIGS. 5-7 illustrate dimensional information of a fastener and parts that form an assembly described herein. The dimensional information, including relative dimensional information, of the fastener and the parts may be present in other embodiments described herein. Also, the fastener and the parts may include features previously described for fasteners and parts, respectively.

FIG. 5 illustrates a plan view of a fastener 316, in accordance with some described embodiments. The fastener 316 may include a fastener head 318a and a shaft 318b. The fastener head 318a may include a dimension 332a and the shaft 318b may include a dimension 332b less than dimension 332a.

FIG. 6 illustrates a plan view of a part 312a, showing a through hole 314a in the part 312a, in accordance with some described embodiments. The through hole 314a may include a dimension 334a, which may define a diameter of the through hole 314a. The through hole 314a may further include a dimension 334b defined in part by a spring element 322a, a spring element 322b, and a spring element 322c. The dimension 334b may generally define an additional diameter that is less than the diameter defined by the dimension 334a. Referring to FIG. 5, the dimension 332b of the shaft 318b is less than the dimension 334b of the through hole 314a. As a result, the shaft 318b may pass through the through hole 314a. Also, the dimension 332a of the fastener head 318a is greater than the dimension 334b. As a result, the fastener head 318a can engage the spring element 322a, the spring element 322b, and the spring element 322c. Further, the dimension 332a of the fastener head 318a may be less than the dimension 334a of the through hole 314a such that the fastener head 318a does not engage portions of the part 312a other than the spring element 322a, the spring element 322b, and the spring element 322c.

FIG. 7 illustrates a plan view of a part 312b, showing a through hole 314b in the part 312b, in accordance with some described embodiments. The through hole 314b includes a dimension 336 that is greater than the dimension 332b of the shaft 318b (shown in FIG. 5). As a result, the shaft 318b of the fastener 316 may pass through the through hole 314b. Further, the through hole 314b is defined in part by a through hole section 324a, a through hole section 324b, and a through hole section 324c. The through hole section 324a, the through hole section 324b, and the through hole section 324c provide a space for the spring element 322a, the spring element 322b, and the spring element 322c, respectively. The through hole 314b is further defined in part by an extension 326a, an extension 326b, and an extension 326c, which define in part the dimension 336. Due in part to the aforementioned extensions, the dimension 336 is less than the dimension 332a of the fastener head 318a. As a result, the extension 326a, the extension 326b, and the extension 326c provide an engagement surface for the fastener 316 (shown in FIG. 5), and in particular, an engagement surface for the fastener head 318a.

During assembly, the shaft 318b passes through the through hole 314a and the through hole 314b, and the fastener head 318a engages the spring element 322a, the spring element 322b, and the spring element 322c. When the fastener head 318a provides sufficient force to the spring element 322a, the spring element 322b, and the spring element 322c, the spring element 322a, the spring element 322b, and the spring element 322c bend and are subsequently positioned in the through hole section 324a, the through hole section 324b, and the through hole section 324c, respectively. As a result, the fastener head 318a engages the extension 326a, the extension 326b, and the extension 326c. Thus, the fastener 316 can engage the part 312a by way of the aforementioned spring elements, and also engage the part 312b by way of aforementioned extensions.

Figure 8:
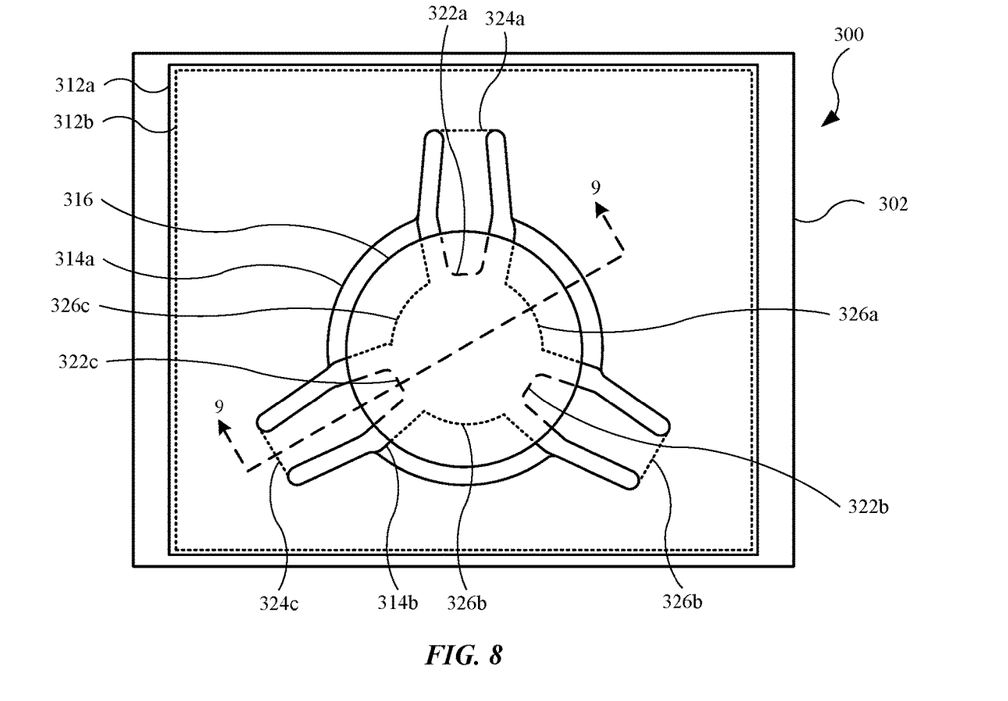
FIG. 8 illustrates a plan view of the fastener shown in FIG. 5, showing the fastener engaging the part shown in FIG. 6 and the part shown in FIG. 7.

FIG. 8 illustrates a plan view of the fastener 316 shown in FIG. 5, showing the fastener 316 engaging the part 312a shown in FIG. 6 and the part 312b shown in FIG. 7. As shown, the part 312a and the part 312b are positioned on an enclosure 302 of an electronic device 300, with the part 312a being positioned over the part 312b. The electronic device 300 may include any features described herein for an electronic device. The shaft 318b (shown in FIG. 5) passes through the thorough hole 314a and the through hole 314b. The spring element 322a, the spring element 322b, and the spring element 322c align with the through hole section 324a, the through hole section 324b, and the through hole section 324c, respectively. As a result, a bending (or deformation) of the spring element 322a, the spring element 322b, and the spring element 322c may cause the spring element 322a, the spring element 322b, and the spring element 322c to at least partially enter the through hole section 324a, the through hole section 324b, and the through hole section 324c, respectively. Also, as shown, the spring element 322a, the spring element 322b, and the spring element 322c are laterally displaced with respect to the extension 326a, the extension 326b, and the extension 326c such that the spring elements do not contact the extensions.

Figure 9:
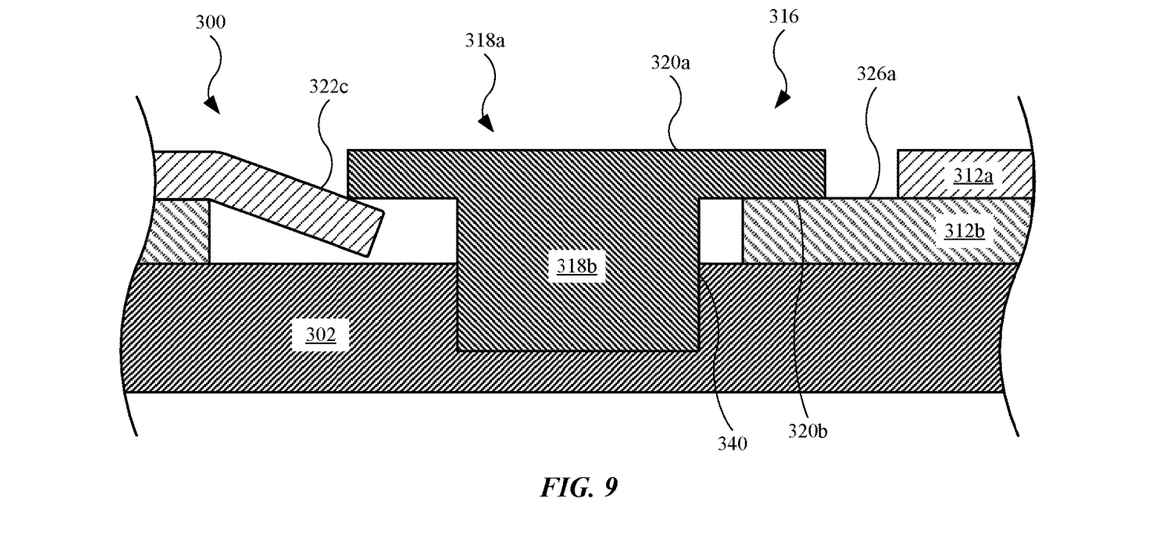
FIG. 9 illustrates a cross sectional view of the electronic device shown in FIG. 8, taken along line 9-9.

FIG. 9 illustrates a cross sectional view of the electronic device 300 shown in FIG. 8, taken along line 9-9. As shown, the fastener 316 passes through the through hole 314a (labeled in FIG. 8) of the part 312a and the through hole 314b (labeled in FIG. 8) of the part 312b. The shaft 318b is positioned in a blind hole 340, or cavity, of the enclosure 302. The fastener head 318a engages the spring element 322c. In particular, an engagement surface 320b (opposite a tool receiving surface 320a) of the fastener head 318a engages the spring element 322c. Further, the spring element 322c bends in response to the engagement with, and a subsequent force provided by, the fastener head 318a, thereby allowing the fastener head 318a (an in particular, the engagement surface 320b) to also engage the extension 326a of the part 312b. As a result, the fastener 316 is in direct engagement with both the part 312a and the part 312b. This engagement may enhance the ability of the fastener 316 to maintain the part 312a and the part 312b in a stationary position. In particular, the fastener head 318a (as opposed to the shaft 318b) is in direct engaged with the part 312a and the part 312b, by way of the engagement surface 320b. This may provide an advantage over scenarios in which a shaft engages only a first part only and provides an indirect engagement to a second part via the first part. Further, when the fastener 316 engages the part 312a, the part 312b, and the enclosure 302, the part 312a and the part 312b can be electrically grounded to the enclosure 302.

FIG. 9 shows an exemplary engagement between the spring element 322c and the fastener head 318a. It should be noted that the fastener head 318a is also engaged with the spring element 322a and the spring element 322b (shown in FIG. 8) in a similar manner. Also, FIG. 9 shows an exemplary engagement between the extension 326a and the fastener head 318a. It should be noted that the fastener head 318a is also engaged with the extension 326b and the extension 326b (shown in FIG. 8) in a similar manner. Further, it should be noted that both the spring element 322a and the spring element 322b can bend in a manner similar to that of the spring element 322c. Also, as shown, the fastener 316 (and in particular, the fastener head 318a) is flush, or co-planar, with respect to the part 312a. Alternatively, however, the fastener head 318a can be proud of, or extend above, the part 312a, or sub-flush with respect to the part 312a.

Figure 10:
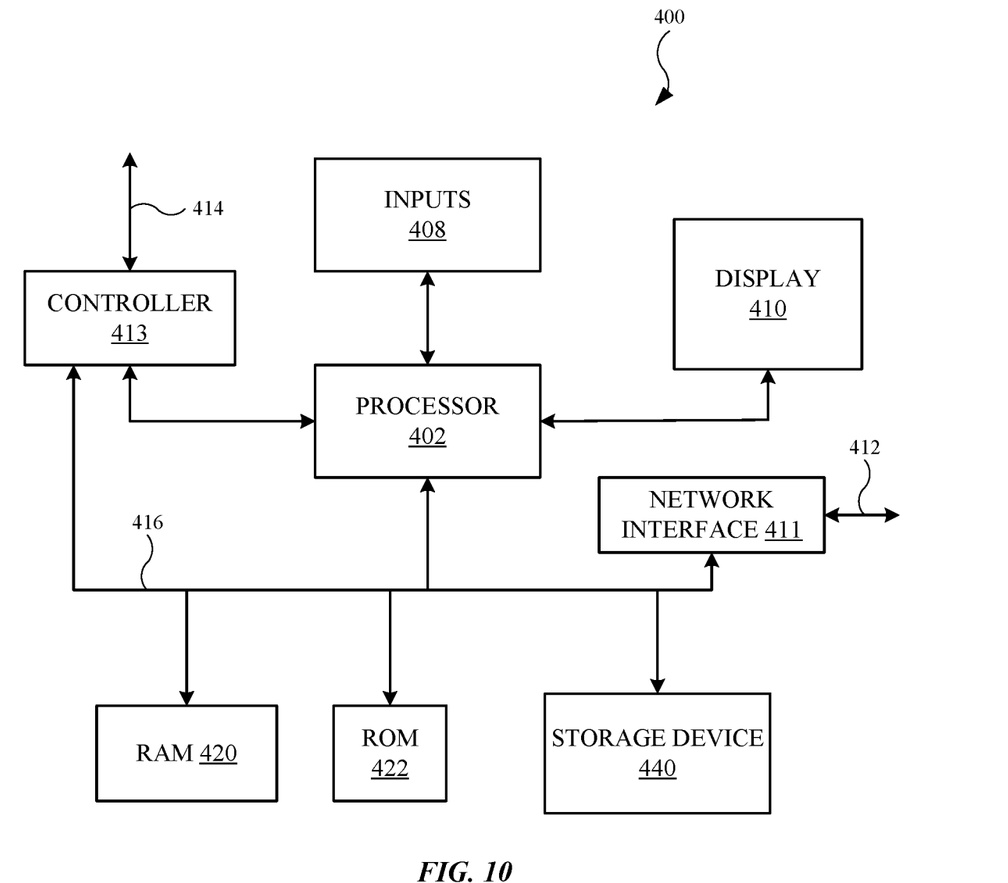
FIG. 10 illustrates a block diagram of an electronic device, in accordance with some described embodiments.

FIG. 10 illustrates a block diagram of an electronic device 400, in accordance with some described embodiments. The components shown for the electronic device 400 in the block diagram may be incorporated into the electronic device 100 (shown in FIG. 1). The electronic device 400 can include a processor 402 that represents a microprocessor or controller for controlling the overall operation of electronic device 400. The electronic device 400 can also include inputs 408. Some of the inputs 408 allow a user of the electronic device 400 to interact with the electronic device 400. For example, the inputs 408 can take the form of a variety of user input devices, such as a button, a keypad, a dial, touch screen, audio input interface, visual/image capture input interface, input in the form of sensor data, etc.

The display 410 (screen display) that can be controlled by the processor 402 to present visual information to the user. The electronic device 400 may further include a controller 413 that can be used to interface with and control different equipment through an equipment control bus 414. A data bus 416 can facilitate data transfer between at least the processor 402, a controller 413, and a storage device 440. The electronic device 400 can also include a network/bus interface 411 that couples to a data link 412. In the case of a wireless connection, the network/bus interface 411 can include a wireless transceiver.

The storage device 440 may include a single disk or multiple disks (e.g., hard drives), as well as a storage management module that manages one or more partitions within the storage device 440. In some embodiments, the storage device 440 can include flash memory, semiconductor (solid state) memory or the like. The electronic device 400 can also include a Random Access Memory 420, or RAM, and a Read-Only Memory 422, or ROM. The Random Access Memory 420 can provide volatile data storage, and stores instructions related to the operation of the electronic device 400. The Read-Only Memory 422 can store programs, utilities or processes to be executed in a non-volatile manner.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
a housing that defines an internal volume, the housing further defining a cavity;
a first part comprising a first through hole defined by spring elements;
a second part comprising a second through hole defined by extensions; and
a fastener that includes a fastener head and a shaft that extends from the fastener head, the shaft capable of aligning the fastener head with the first through hole and the second through hole such that when the first part and the second part are fastened together, (i) the fastener head engages the spring elements and the extensions, and (ii) the shaft is positioned within the cavity.

2. The electronic device of claim 1, wherein the spring elements bend with respect to the first part such that the fastener head is co-planar with respect to the first part.

3. The electronic device of claim 1, wherein the second part is positioned between the first part and the housing.

4. The electronic device of claim 1, wherein the first part comprises a circuit board.

5. The electronic device of claim 1, further comprising a display coupled to the housing.

6. The electronic device of claim 1, wherein the shaft lacks contact with the first part and the second part.

7. An electronic device, comprising:
a housing that defines an internal volume, the housing further defining a cavity;
a first part comprising a first through hole defined by spring elements;
a second part comprising a second through hole defined by extensions; and
a fastener, comprising:
a fastener head comprising:
a tool receiving surface, and
an engagement surface opposite the tool receiving surface; and
a shaft that extends from the fastener head, the shaft capable of aligning the fastener head with the first through hole and the second through hole such that when the first part and the second part are fastened together, (i) the engagement surface engages the spring elements and the extensions, and (ii) the shaft is positioned within the cavity.

8. An electronic device, comprising:
a housing comprising a first opening and a second opening, the housing further comprising a blind hole at least partially positioned between the first opening and the second opening;
a first part comprising a first through hole that defines a spring element;
a second part engaged with the first part, the second part comprising a second through hole; and
a fastener positioned in the blind hole and passing through the first through hole and the second through hole, the fastener causing the spring element to bend such that the spring element is positioned in the second through hole.

9. The electronic device of claim 8, wherein the fastener comprises a fastener head that is engaged with the spring element and the second part, and wherein the fastener head is co-planar with respect to the first part.

10. The electronic device of claim 9, wherein the second part is positioned between the first part and the housing.

11. The electronic device of claim 9, wherein the second through hole defines an extension, and wherein the fastener head engages the extension.

12. The electronic device of claim 11, wherein the fastener head comprises:
a tool receiving surface; and
an engagement surface opposite the tool receiving surface, the engagement surface engaged with the spring element and the extension.

13. The electronic device of claim 8, wherein:
the first part comprises a second spring element and a third spring element,
the second part comprises a first extension, a second extension, and a third extension, and
the fastener engages the second spring element, the third spring element, the first extension, the second extension, and the third extension.

14. The electronic device of claim 8, wherein the first part comprises a circuit board, and wherein the second part comprises a metal or a plastic.

15. An electronic device, comprising:
a fastener comprising a fastener head, the fastener head comprising a fastener diameter;
a first part comprising a first through hole that defines a first diameter, the first part comprising spring elements that define a second diameter of the through hole that is different from the first diameter, the second diameter being less than the fastener diameter;
a second part comprising a second through hole that defines a third diameter, the second part comprising extensions that define a fourth diameter of the through hole that is different from the third diameter, the fourth diameter being less than the fastener diameter; and
a housing comprising a cavity, wherein the fastener passes through the first through hole and the second through hole and is positioned in the cavity.

16. The electronic device of claim 15, wherein the fastener head engages the spring elements and the extensions.

17. The electronic device of claim 16, wherein the fastener head is co-planar with respect to the first part.

18. The electronic device of claim 15, wherein the first part comprises a circuit board.

19. The electronic device of claim 15, further comprising a display coupled with the housing.

20. The electronic device of claim 15, wherein the spring elements bend into the second through hole.

* * * * *